US007595262B2

(12) United States Patent
Schlösser

(10) Patent No.: US 7,595,262 B2
(45) Date of Patent: *Sep. 29, 2009

(54) MANUFACTURING METHOD FOR AN INTEGRATED SEMICONDUCTOR STRUCTURE

(75) Inventor: Till Schlösser, Dresden (DE)

(73) Assignee: Qimonda AG, Munich (DE)

( * ) Notice: Subject to any disclaimer, the term of this patent is extended or adjusted under 35 U.S.C. 154(b) by 4 days.

This patent is subject to a terminal disclaimer.

(21) Appl. No.: 11/588,591

(22) Filed: Oct. 27, 2006

(65) Prior Publication Data

US 2008/0102578 A1 May 1, 2008

(51) Int. Cl.
*H01L 21/3205* (2006.01)
*H01L 21/4763* (2006.01)
*H01L 21/8236* (2006.01)
*H01L 21/8234* (2006.01)
*H01L 21/8242* (2006.01)
*H01L 21/336* (2006.01)
*H01L 21/44* (2006.01)
*H01L 21/28* (2006.01)

(52) U.S. Cl. .............. 438/585; 438/241; 438/257; 438/270; 438/275; 438/277; 438/283; 438/578; 438/587; 257/E21.656; 257/E21.659; 257/E21.66

(58) Field of Classification Search .......... 257/E21.646, 257/E21.651, E21.66, E21.656, E21.659
See application file for complete search history.

(56) References Cited

U.S. PATENT DOCUMENTS

| 5,134,085 | A | * | 7/1992 | Gilgen et al. .............. 438/210 |
| 5,766,969 | A | * | 6/1998 | Fulford et al. ............. 438/305 |
| 5,798,544 | A | * | 8/1998 | Ohya et al. ................ 257/296 |
| 5,910,676 | A | * | 6/1999 | Prengle et al. ............ 257/378 |
| 6,069,054 | A | * | 5/2000 | Choi ......................... 438/423 |
| 6,074,908 | A | | 6/2000 | Huang |
| 6,545,904 | B2 | * | 4/2003 | Tran .......................... 365/149 |
| 7,034,408 | B1 | * | 4/2006 | Schloesser ................. 257/213 |
| 7,316,956 | B2 | * | 1/2008 | Young et al. .............. 438/268 |
| 2004/0043592 | A1 | * | 3/2004 | Goodwin et al. .......... 438/586 |
| 2004/0259306 | A1 | | 12/2004 | Sakai et al. |
| 2006/0110884 | A1 | * | 5/2006 | Wang et al. ................ 438/270 |
| 2006/0192249 | A1 | | 8/2006 | Kim et al. |
| 2007/0057301 | A1 | * | 3/2007 | Wang et al. ................ 257/296 |
| 2007/0259494 | A1 | * | 11/2007 | Park et al. .................. 438/238 |

* cited by examiner

*Primary Examiner*—Savitri Mulpuri
*Assistant Examiner*—Mohsen Ahmadi
(74) *Attorney, Agent, or Firm*—Eschweiler & Associates, LLC

(57) ABSTRACT

A manufacturing method for an integrated semiconductor structure and a corresponding semiconductor structure is disclosed. The method includes forming a peripheral circuitry in a peripheral device region, wherein the peripheral circuitry includes a peripheral transistor at least partially formed in the semiconductor substrate and having a first gate dielectric formed in a first high temperature process step. The method further includes forming a plurality of memory cells in a memory cell region, each of said memory cells including an access transistor at least partially formed in a semiconductor substrate and having a second gate dielectric formed in a second high temperature process step and having a metallic gate conductor. The first and second high temperature process steps are performed before a step of forming the metallic gate conductor.

12 Claims, 12 Drawing Sheets

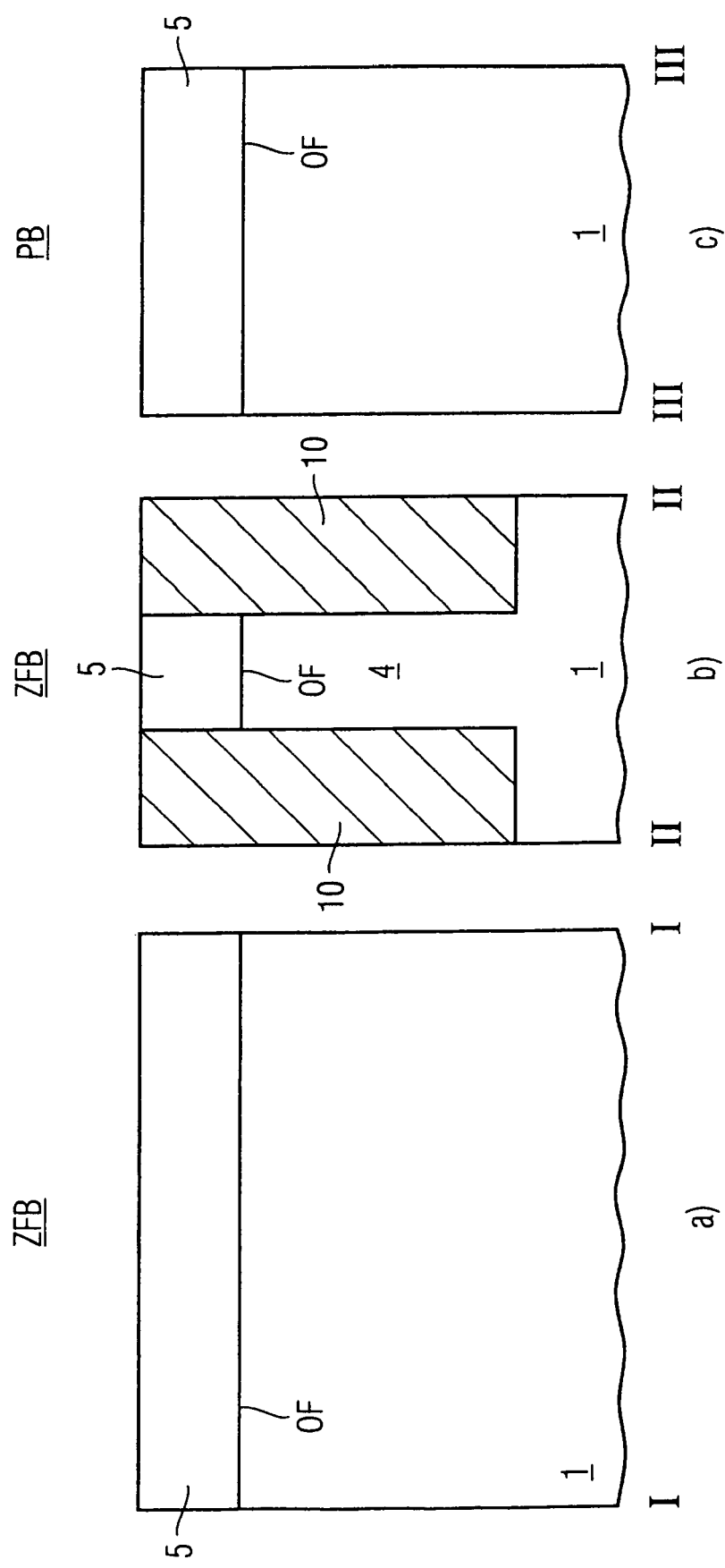

FIG 1B
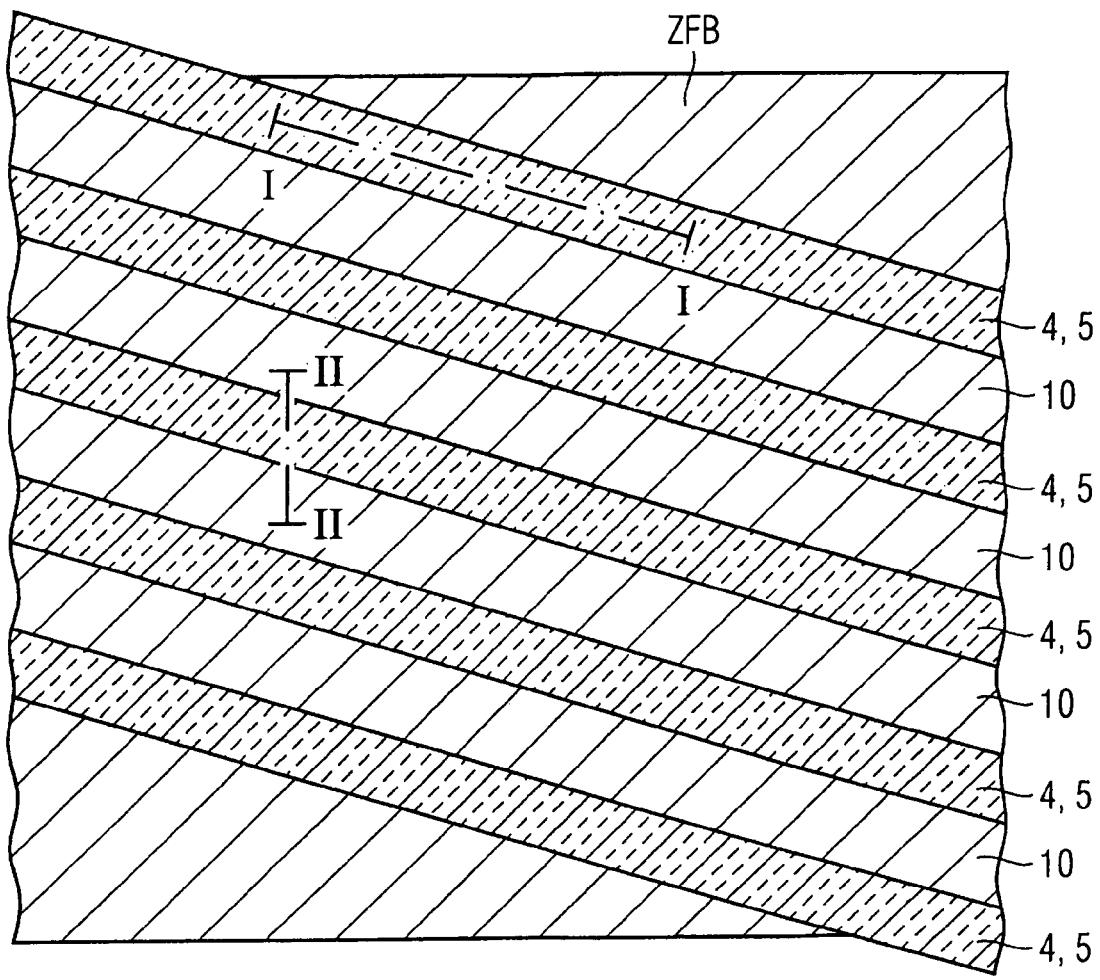
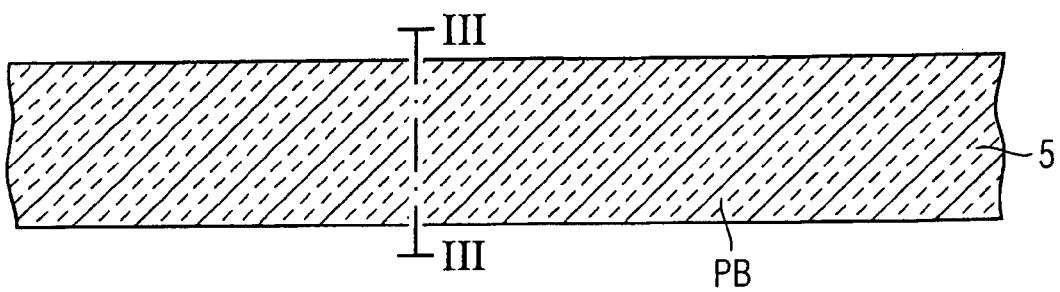

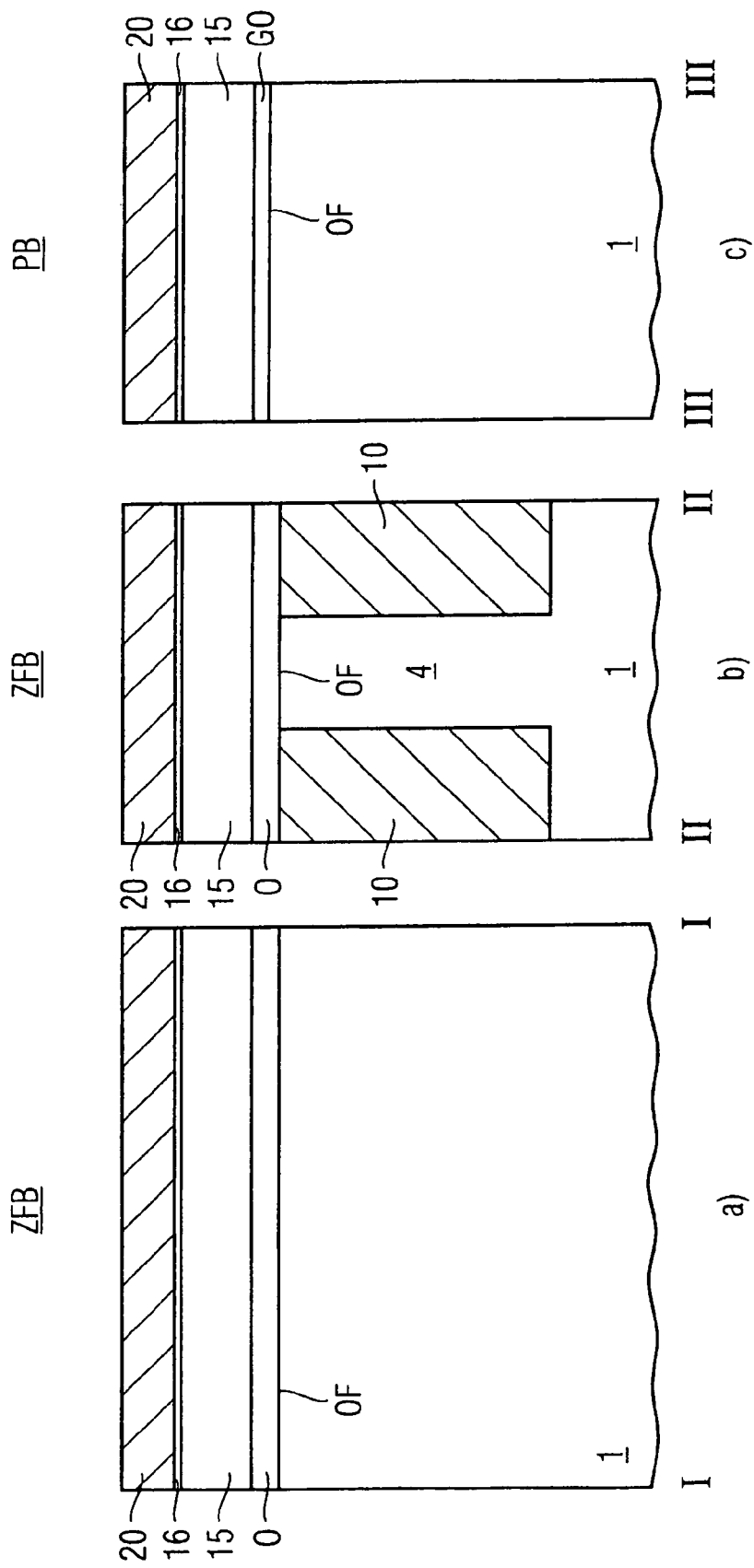

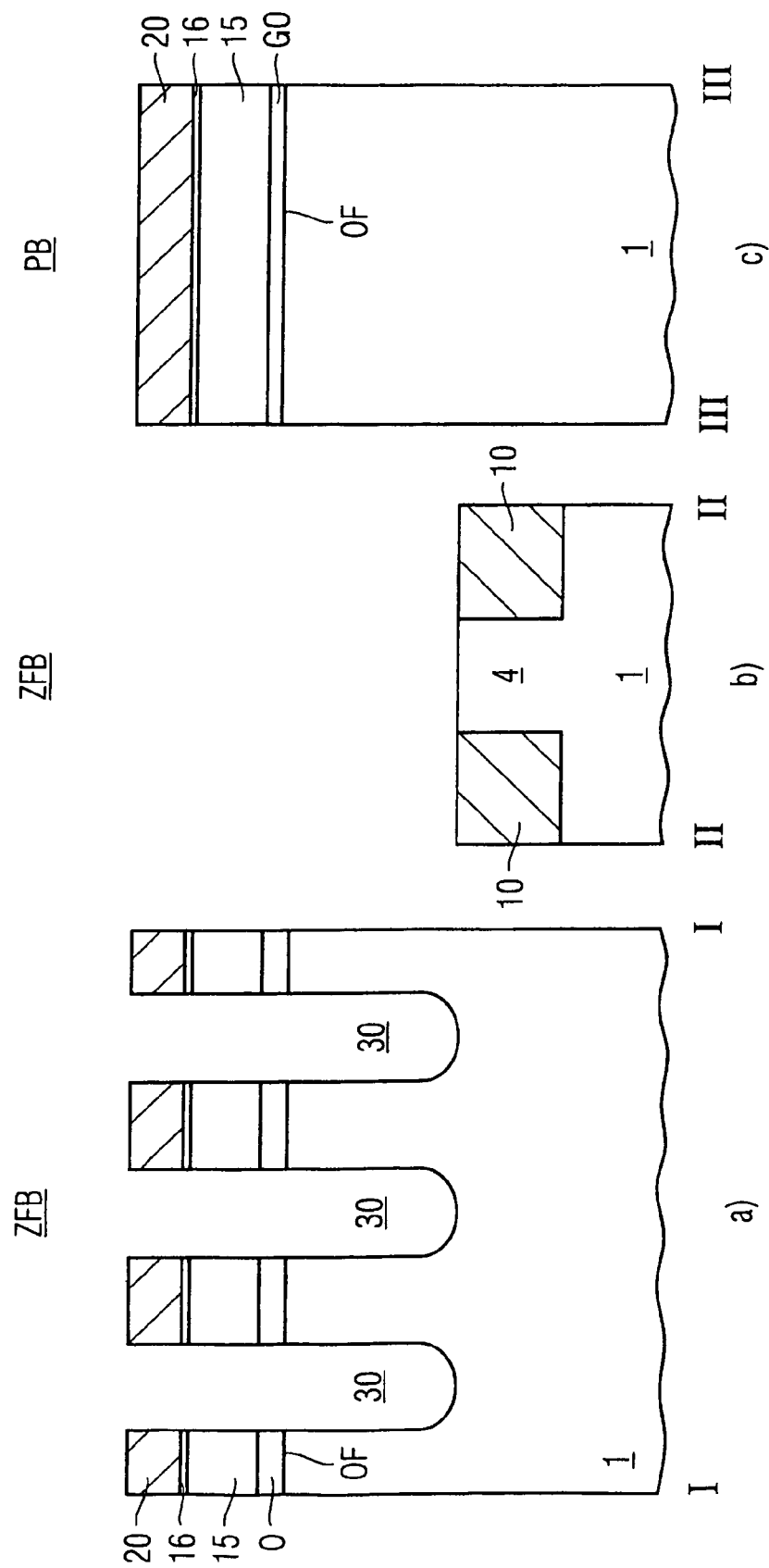

FIG 8B
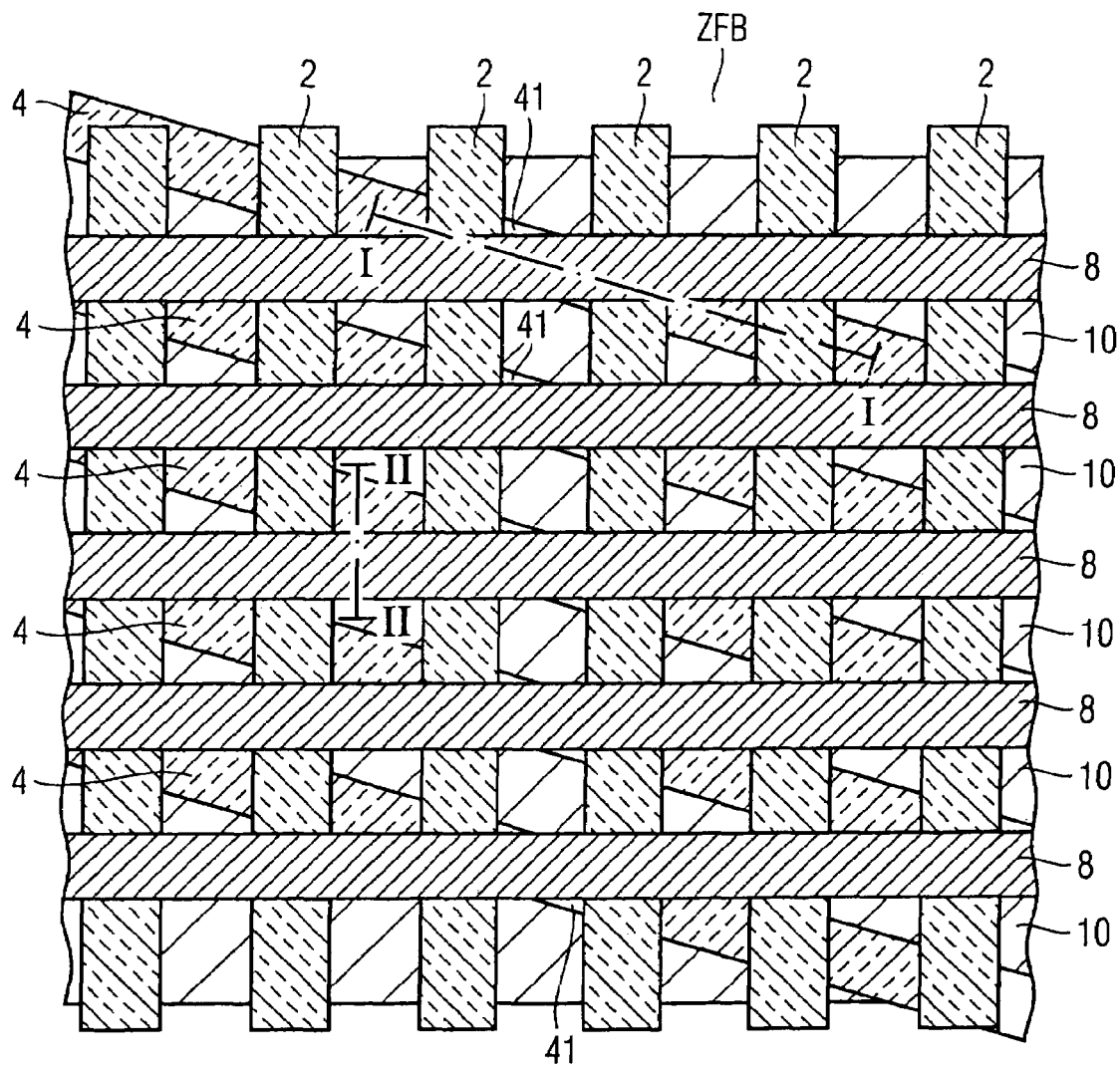
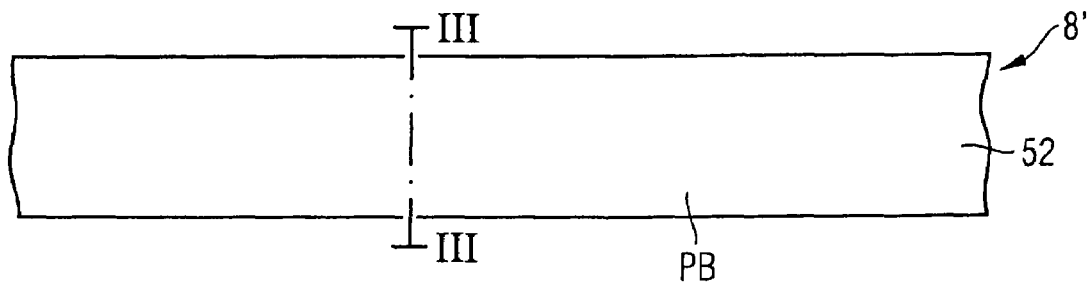

MANUFACTURING METHOD FOR AN INTEGRATED SEMICONDUCTOR STRUCTURE

BACKGROUND OF THE INVENTION

1. Field of the Invention

The present invention relates to a manufacturing method for an integrated semiconductor structure.

2. Description of the Related Art

Although in principle applicable to arbitrary integrated semiconductor structures, the following invention and the underlying problems will be explained with respect to integrated DRAM memory circuits in silicon technology which are scaled down to far below 100 nm generation and provide big challenges.

Memory cells of a dynamic random access memory (DRAM) generally comprise a storage capacitor for storing an electrical charge which represents an information to be stored, and an access transistor which is connected with a storage capacitor. The access transistor comprises source/drain regions, a channel connecting the source/drain regions as well as a gate electrode controlling an electrical current flow between the source/drain regions. The transistor usually is at least partially formed in the semiconductor substrate. The gate electrode forms a part of a word-line and is electrically isolated from the channel by a gate dielectric. By addressing the access transistor via the corresponding word-line, the information stored in the storage capacitor is read out or programmed. In particular, the information is read out to a corresponding bit-line via a bit-line contact.

In the currently used DRAM memory cells, the storage capacitor can be implemented as a trench capacitor in which the two capacitor electrodes are disposed in a trench which extends in the substrate in a direction perpendicular to the substrate surface. According to another implementation of a DRAM memory cell, the electrical charge is stored in a stacked capacitor which is formed above the surface of the substrate.

Memory devices usually comprise a memory cell array and a peripheral device area. Generally, the peripheral device area of memory devices includes circuitry for addressing memory cells and for sensing and processing the signals received from the individual memory cells. Usually, the peripheral portion is formed in the same semiconductor substrate as the individual memory cells. Hence, it is highly desirable to have a robust manufacturing process by which a cell array and peripheral components of the memory device can be formed simultaneously and safely with high yield.

U.S. Pat. No. 7,034,408 B1 the disclosure of which is fully incorporated herein by reference discloses a memory device and a method of manufacturing a memory device.

Particularly, the known method comprises the steps of: Forming memory cells by providing access transistors, each of the access transistors comprising a first and a second source/drain region, a channel disposed between the first and the second source/drain regions and a gate electrode that is electrically isolated from the channel and adapted to control the conductivity of the channel, the access transistor being at least partially formed in a semiconductor substrate including a surface, and by providing storage elements for storing information, each of the storage elements being adapted to be accessed by one of the access transistors; providing bit-lines extending in a first direction along the substrate, the bit-lines being connected to the first source/drain regions of the access transistors via bit-line contacts; providing word-lines extending in a second direction along the substrate, the second direction intersecting the first direction; and providing peripheral circuitry, the peripheral circuitry comprising at least one peripheral transistor, the peripheral transistor comprising a first and a second peripheral source/drain region, a peripheral channel connecting the first and second peripheral source/drain regions and a peripheral gate electrode controlling the conductivity of the peripheral channel, the gate electrode of the access transistor forming part of one of the word-lines, the peripheral circuitry being connected with the word-lines and the bit-lines, wherein a top surface of the word-line is disposed beneath the substrate surface, and the peripheral gate electrodes and the bit-lines including the bit-line contact are made by forming a layer stack comprising at least one layer on the substrate surface so as to cover the memory cells and the peripheral circuitry, and, subsequently patterning the layer stack so as to form the bit-lines and the peripheral gate electrodes.

It is a problem with this known method of manufacturing a memory device that certain metals used for the word-lines, such as TiN, TaN, W and similar ones, are very sensitive against high temperature process steps, particularly oxidation process steps, involving temperatures of typically 800° C. and above. Thus, the support or peripheral device gate oxidation can also unadvertendly oxidize the metal of the word-lines.

On the other hand, it is a difficult task to provide high temperature process steps in the beginning of the process sequence before the word-line metal deposition without making the process sequence making much more complex and without loosing a plurality of simultaneous process steps for memory cell array and periphery devices.

BRIEF SUMMARY OF THE INVENTION

According the invention as claimed in claim 1, a manufacturing method for an integrated semiconductor structure comprises the steps of: forming a peripheral circuitry in a peripheral device region, said peripheral circuitry comprising a peripheral transistor at least partially formed in said semiconductor substrate and having a first gate dielectric formed in a first high temperature process step; forming a plurality of memory cells in a memory cell region, each of said memory cells comprising an access transistor at least partially formed in a semiconductor substrate and having a second gate dielectric formed in a second high temperature process step and having a metallic gate conductor; wherein said first and second high temperature process steps are performed before a step of forming said metallic gate conductor.

The underlying idea of the present invention is to split the support or the peripheral device process in parts before the word-line formation and after the word-line formation while keeping many simultaneous process steps of memory cell and peripheral device regions.

Preferred embodiments are listed in the respective dependent claims.

According to an embodiment, said first high temperature process step is performed before said second high temperature process step.

According to another embodiment, the following steps are performed: forming an insulating layer on said substrate in said memory cell region; performing said first high temperature process step; depositing a first polysilicon layer on said insulating layer in said memory cell region and on said first gate dielectric in said peripheral device region; depositing a nitride layer on said polysilicon layer; forming a hardmask on said nitride layer; forming word-line grooves in said substrate in said memory cell region; performing said second high temperature process step; and forming said metallic gate conductor on said second gate dielectric in said word-line grooves; and removing said hardmask and said nitride layer.

According to another embodiment, the following steps are performed: exposing a bitline contact region of said access transistor in said memory cell region in an etch step wherein said polysilicon layer and insulating layer are removed from said substrate; depositing a second polysilicon layer in said memory cell region and in said peripheral device region; and planarizing said first and second polysilicon layers such that they form a planar common upper surface.

According to another embodiment, the following steps are performed: depositing at least one conductive layer on said planar common upper surface; depositing an insulating layer on said at least one conductive layer; and simultaneously structuring said first and second polysilicon layers, said at least one conductive layer, and said insulating layer such that they form a bitline connected to said access transistor in said memory cell region and a gate stack of said peripheral transistor in said peripheral device region.

According to another embodiment, active area stripes separated by STI-trenches are formed along a first direction in said memory cell region and said access transistors are formed in said active area stripes.

According to another embodiment, wherein the bitline contact region is defined photolithographically using a mask having a lines/space pattern so as to expose portions where the bitline contact region is to be exposed; and said etch steps wherein said polysilicon layer and insulating layer are removed from said substrate are selective with respect to said insulating layer.

According to another embodiment, buried word-lines extending in a second direction are formed in said substrate in said memory cell region, said second direction intersecting said first direction.

According to another embodiment, bitlines extending in a third direction are formed on said substrate in said memory cell region, said second and third direction being perpendicular to each other.

According to another embodiment, insulating sidewall spacers are simultaneously formed on said bitline in said memory cell region and on said gate stack in said peripheral device region.

According to another embodiment, said first and second high temperature process steps are oxidation process steps in a temperature range between 800 and 1100° C.

DESCRIPTION OF THE DRAWINGS

In the Figures:

FIG. 1A-8B show schematic layouts of a manufacturing method for an integrated semiconductor structure according to an embodiment of the present invention, particularly FIGS. 1A, 2, 3, 4, 5A, 6A, 7, 8A in three different cross-sections a), b), c), and FIGS. 1 B, 5B, 6B, 8B in schematic plane views.

Figure 3:
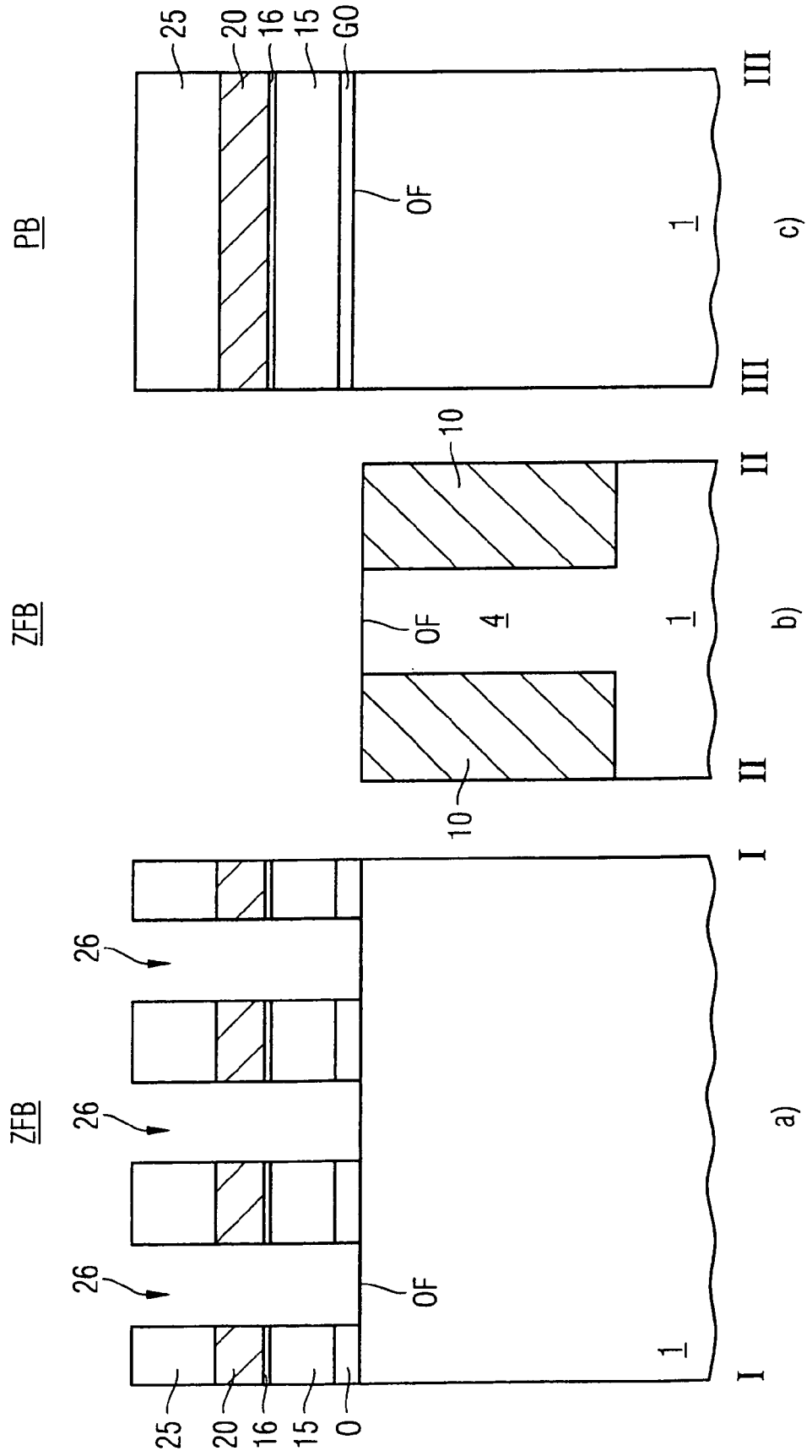

In the Figures, identical reference signs denote equivalent or functionally equivalent components.

DESCRIPTION OF THE PREFERRED EMBODIMENTS

FIG. 1A-8B show schematic layouts of a manufacturing method for an integrated semiconductor structure according to an embodiment of the present invention, particularly FIGS. 1A, 2, 3, 4, 5A, 6A, 7, 8A in three different cross-sections a), b), c), and FIGS. 1 B, 5B, 6B, 8B in schematic plane views.

The process sequence starts in the status shown in FIGS. 1A, B. Particularly, FIG. 1B is a plane view of the memory cell region ZFB and the peripheral device region PB, whereas FIG. 1A depicts three cross-sections a) along line I-I, b) along line II-II, and c) along line III-III in FIG. 1B.

In FIG. 1A, reference sign 1 denotes a silicon semiconductor substrate. On the upper surface OF of said silicon semiconductor substrate 1, a silicon nitride mask 5 in form of nitride stripes has been formed which nitride stripes are located on active area lines 4 in the memory cell region ZFB. Between the active area lines 4, STI insulation trenches 10 filled with a dielectric material have been formed using said nitride stripes 5 as a mask in a corresponding etch step. The upper level of the filled insulation trenches 10 is equal of the upper level of the nitride stripes 5 which can be achieved by a dielectric deposition process, e.g. selective oxidation followed by high density plasma oxide deposition, and a subsequent chemical-mechanical polishing step.

In particular, cross section a) along line I-I is taken along an active area-line 4, cross section b) along line II-II is taken across an active area-line 4 and perpendicular to a bit-line 8 to be formed later (cmp. FIG. 8B) and cross-section c) along line III-III is taken across a portion of the peripheral device region PB and is oriented in the same direction as cross section b) along line II-II.

Furthermore, with reference to FIG. 2, the nitride mask 5 is stripped, and in not illustrated process steps a planar sacrificial oxide is formed, implantations for well and source/drain regions into the active area lines 4 are performed, and the planar sacrificial oxide is stripped again.

In a next process step an oxide layer O is deposited on the upper surface OF of substrate 1 both in the memory cell region ZFB and in the peripheral device region PB.

Then, another (not shown) block mask, e.g. made of photoresist, is formed over the memory cell region ZFB, and thereafter said oxide layer O is removed from the surface OF of the substrate 1 in the peripheral device region PB. In a next process step, after removal of the photoresist a gate oxide layer GO is formed in the peripheral device region in a high temperature forming step involving temperatures of typically 800° C. and above.

Then, the (not shown) block mask is removed from the memory cell region ZFB, and a thick undoped polysilicon layer 15 is deposited over the entire structure and optionally planarized by a chemical-mechanical polishing step.

In a next process step, a thin oxide layer 16 is optionally deposited over the entire structure. Then a silicon nitride layer 20 is deposited over thin oxide layer 16 in the entire structure which leads to the process state shown in FIG. 2.

It should be noted here that the silicon nitride layer 20 acts as a polish stop layer in following process steps and may also comprise a plurality of equal or different layers which can equally perform the function of a polish stop layer.

Moreover, it should be already noted here that the polysilicon layer 15 will have the function of a gate electrode layer in the peripheral device region PB and the function of a bit-line connection layer in the memory cell area ZFB.

As shown in FIG. 3, a hard mask layer 25 is formed and structured such that it comprises hard mask openings 26 in the memory cell area ZFB for forming word-line grooves 30 in a subsequent etch step after the underlying layers 20, 16, 15, O have been structured accordingly, which is also shown in FIG. 3. Moreover, the hard mask layer 25 serves as a protective block mask layer in the peripheral device region PB during these word-line groove formation steps.

As shown in FIG. 4, a non-selective etch step is performed so as to form the word-line grooves 30 in the silicon semiconductor substrate 1. Thereafter, the hard mask 25 is stripped by generally known methods. In a subsequent process step, an isotropic etching step, e.g. a wet etching step or a dry etching step is performed so as to form a curvature at the bottom of the word-line grooves 30 and to widen the word-line grooves 30, the latter widening being not shown here. The curvature of the bottom of the word-line grooves 30 is to avoid a non-uniform electrical field distribution at these portions.

Thereafter, another etching step could be performed on the structure of FIG. 4 which is an oxide etch step in order to provide special corner device formation.

Figure 5A:
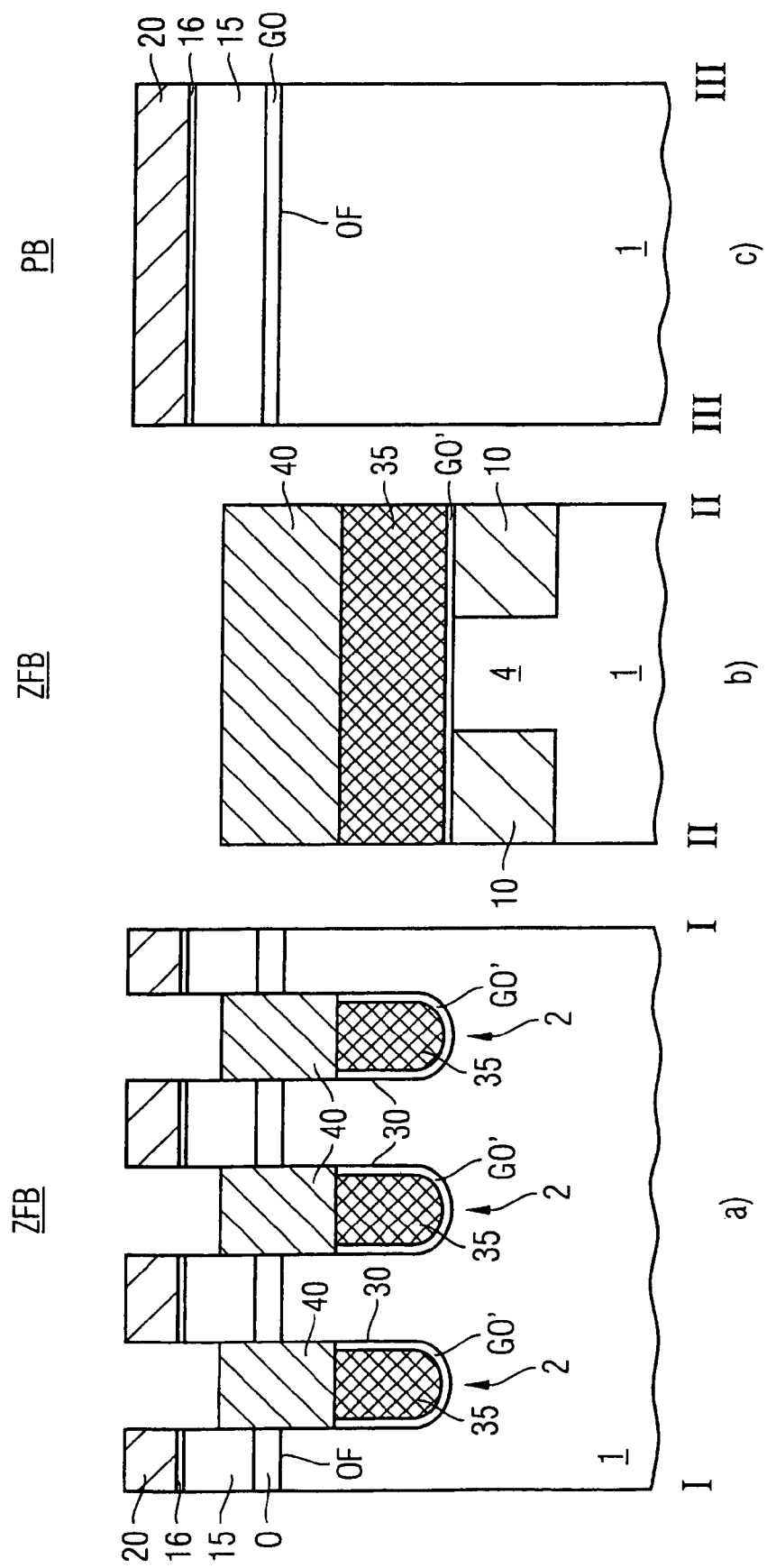
Figure 5B:
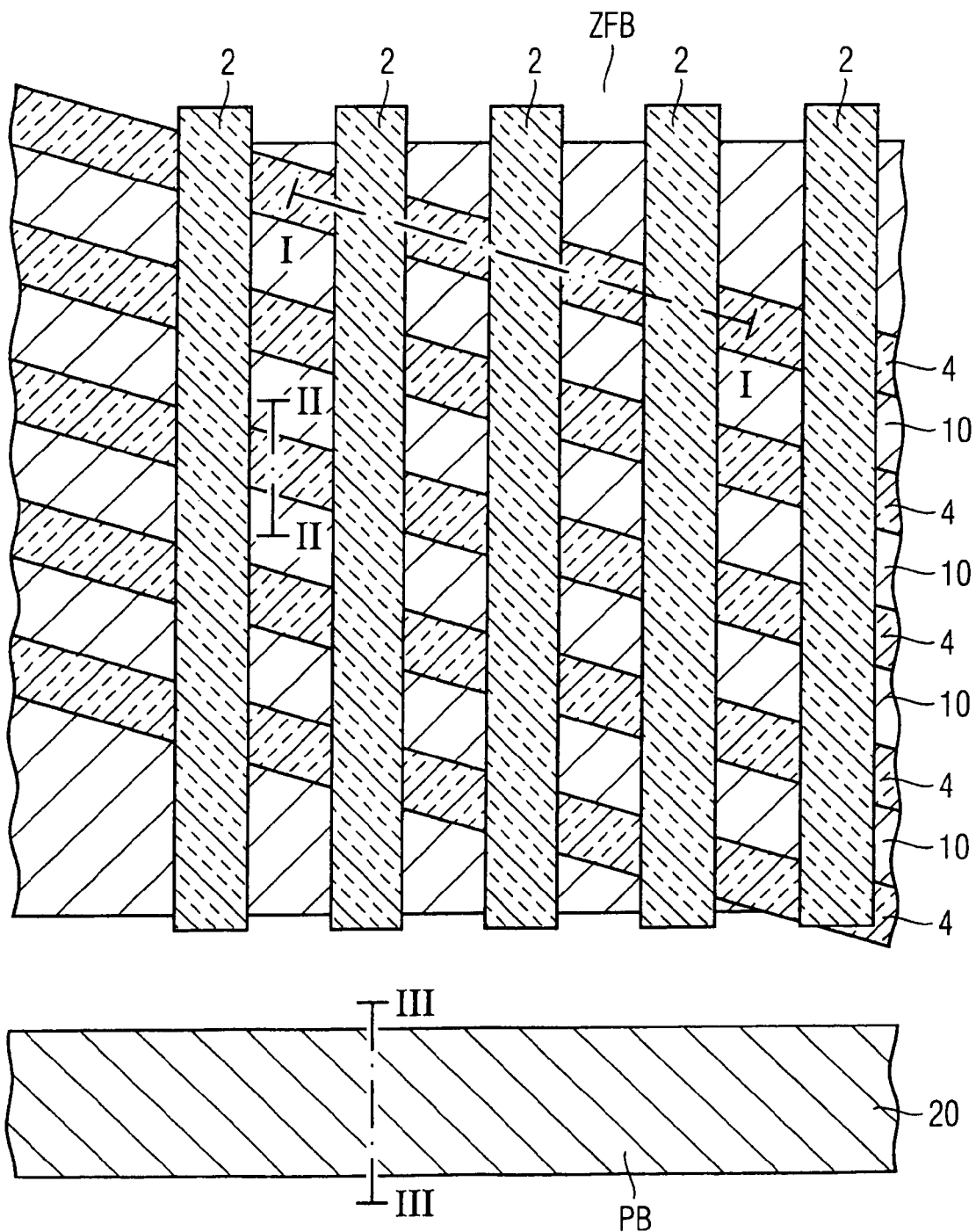

Next as shown in FIGS. 5A, B, a thermal oxidation step at temperatures of typically 800° C. and above is performed in order to provide a gate oxide layer GO' in the word-line grooves 30. Thereafter, the word-line grooves 30 are filled with the word-line metals such as TiN or W or TaN in a deposition step, whereafter the gate oxide layer GO' and said metal fill 35 of the word-lines 2 are polished and etched back to below the surface OF of the silicon semiconductor substrate 1.

In a subsequent process step, an oxide fill 40 is deposited planarized and etched back to a level which is above the surface OF and here about in the middle of the polysilicon layer 15.

Figure 6A:
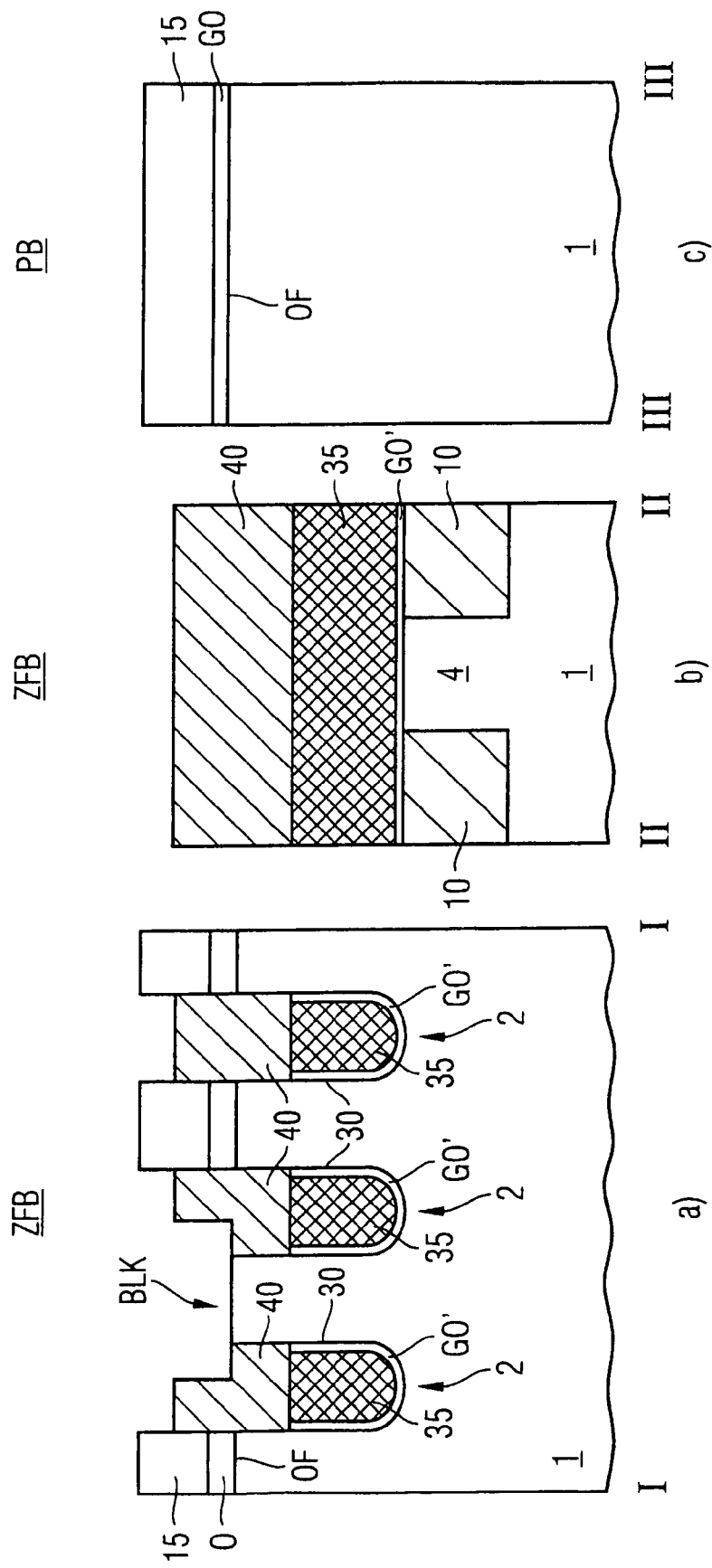

As shown in FIGS. 6A, B, in a next process step the silicon nitride layer 20 is stripped. Thereafter, the bit-line contact areas BLK are photolithographically defined. As can be seen from FIG. 6B, a block mask 411 having openings 412 in the form of stripes is used. To this end, first, a photo-resist layer is applied to the surface of the entire structure and thereafter it is photolithographically patterned in order to create the openings 412 in form of said stripes.

Figure 6B:
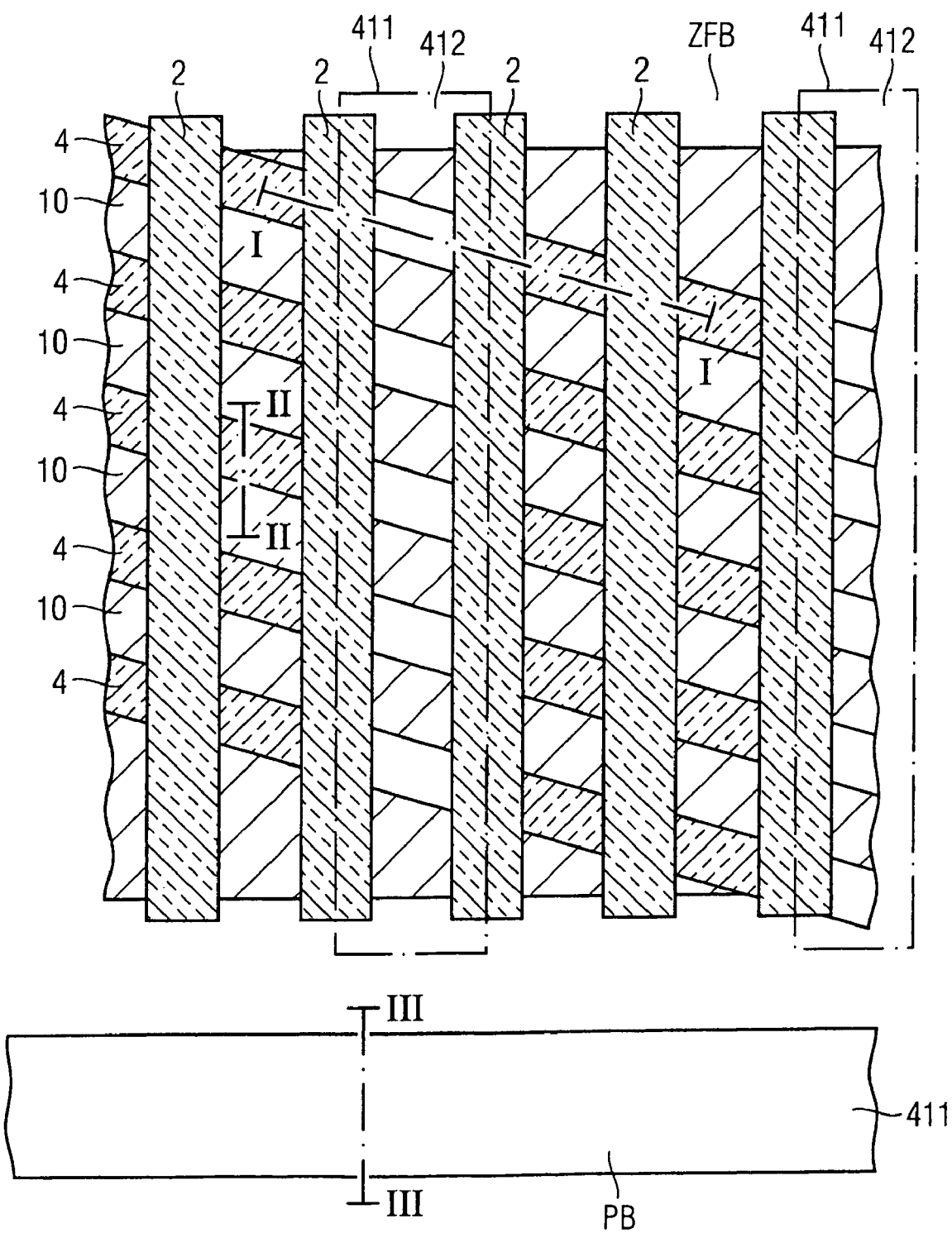

As may be obtained from FIG. 6B, said openings 412 extend widthwise from the middle of one word-line 2 to the middle of an adjacent word-line 2. Then, in widthwise direction there is an intervening isolation word-line 2 which is not electrically used, and then follows the next window 412 extending from the middle of one word-line 2 to the middle of a next word-line 2.

After forming said photo-resist block mask 41 1, first an oxide etch step is performed for removing the oxide layer 16 from the area within the mask openings 412. Thereafter, also using said block mask 411, a polysilicon etch step is performed which selectively removes the polysilicon within the openings 412 of the block mask 411. Thereafter, the block mask 411 is stripped by a conventional technique. Then the entire structure is subjected to an oxide etch step without any mask which oxide etch step removes the oxide layer O from the bit-line contact region BLK of the silicon semiconductor substrate 1 and from the upper surface of the remaining polysilicon layer 15. This leads to the process state shown in FIGS. 6A, B. It should be mentioned that depending on the thicknesses of oxide layers 16 and O, it is also possible to leave a residual portion of layer 16 after the breakthrough of layer O in said bit-line contact region BLK (see below as alternative approach).

Figure 7:
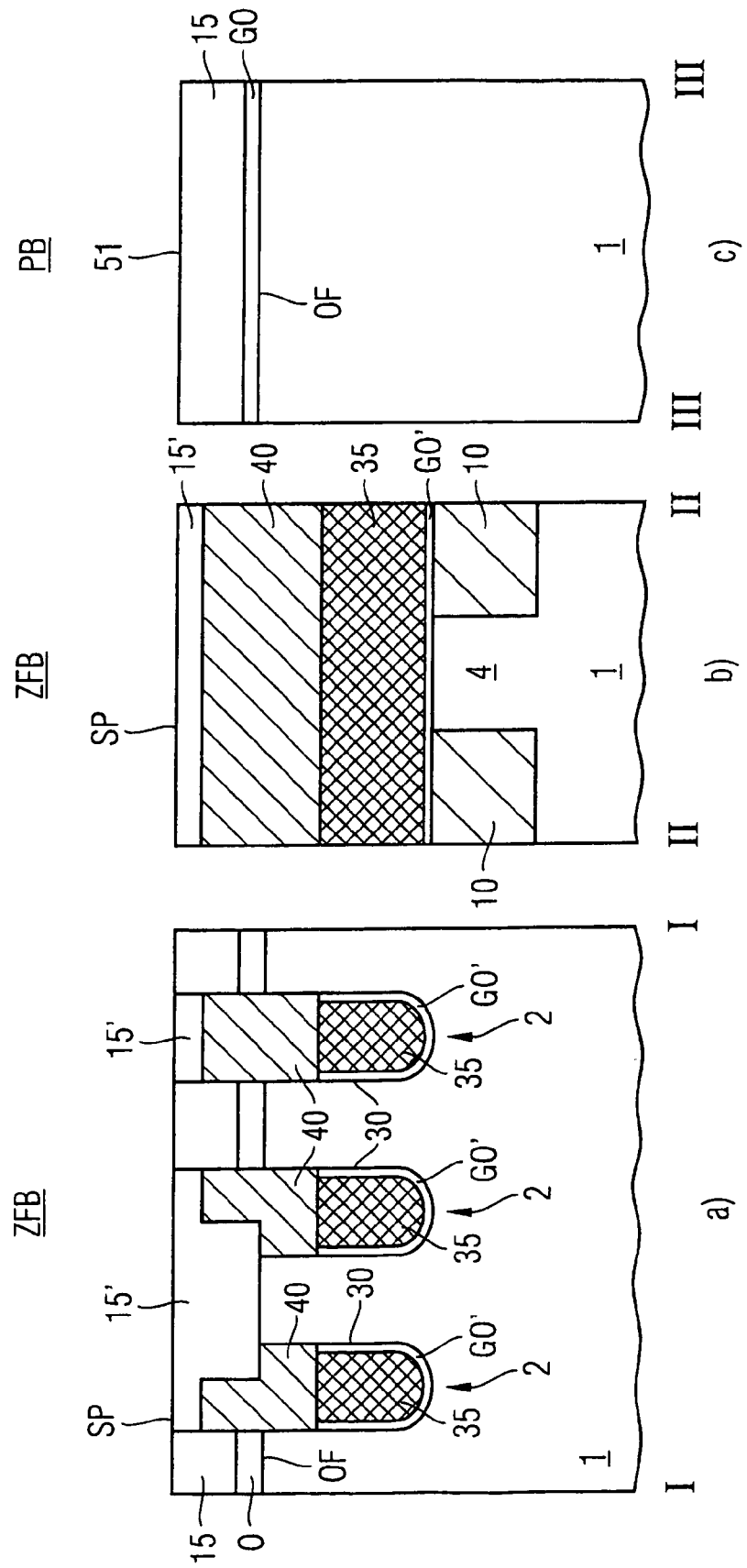

As shown in FIG. 7, after performing a wet clean step, a second polysilicon layer 15' is deposited over the entire structure and polished back in a chemical-mechanical polishing or etchback step so as to form a planar surface SP with the first polysilicon layer 15. This leads to the process status shown in FIG. 7.

Said alternative approach would be to provide an oxide layer 16 which is thicker than the oxide layer O and to leave a residual thickness of said oxide layer 16 after breakthrough of the oxide layer O on said bit-line contact area BLK. In this case a dry polysilicon etch could be performed on the polysilicon layer 15 which stops on the remaining oxide layer 16 in the periphery whereafter the remaining oxide layer 16 is removed.

Figure 8A:
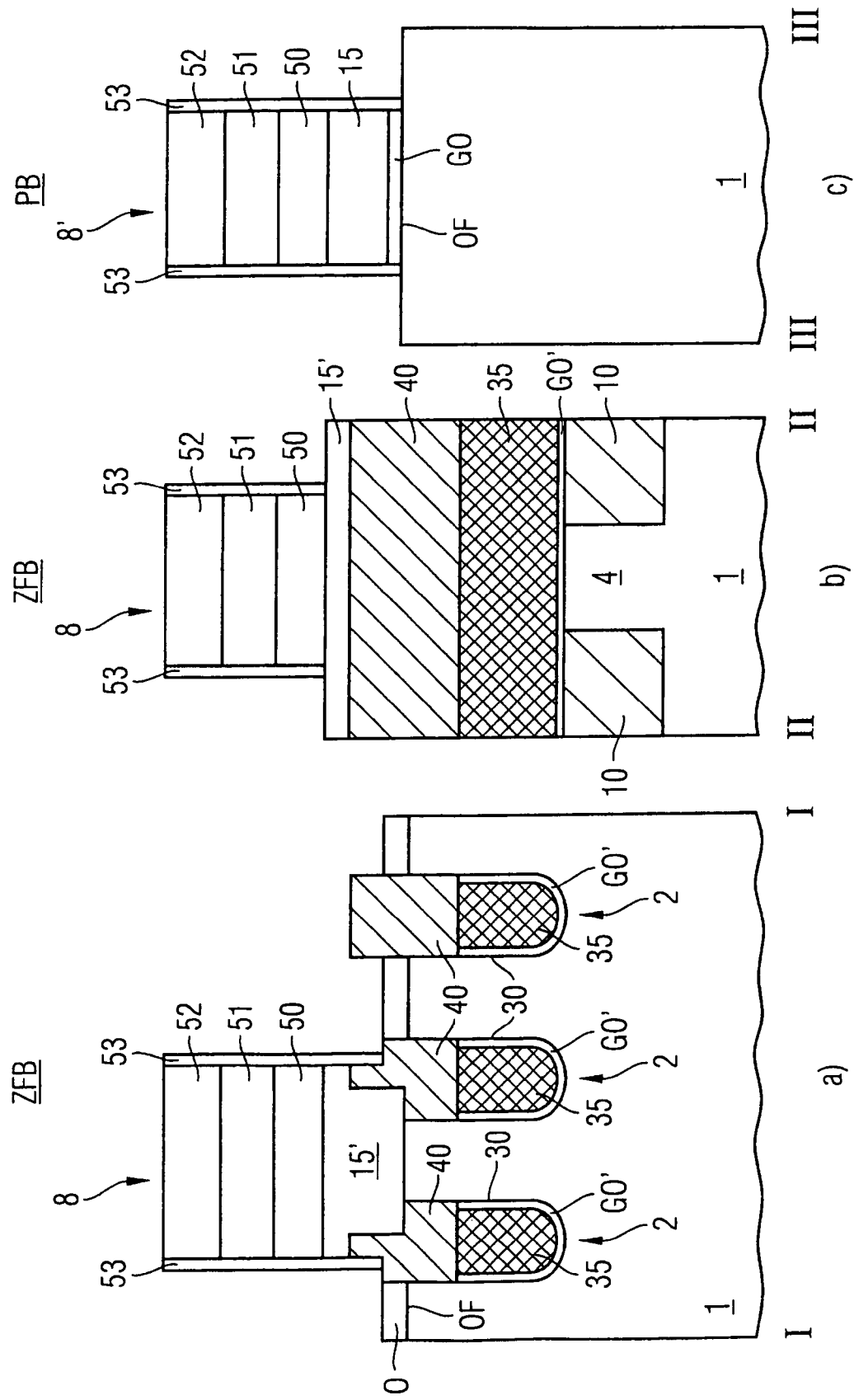

As shown in FIGS. 8A, B, a barrier layer 50 which can e.g. be made of Ti, TiN or Wn, is deposited over the surface SP of polysilicon layers 15, 15'. Thereafter, a tungsten layer 51 and a nitride cap layer 52 are deposited on the barrier layer. Then, bit-lines 8, 8 in the memory cell area ZFB and gate-stacks 8' in the peripheral device area PB are formed, respectively, by a photolithography/etch process step performed on said layer 15/15', 50, 51, 52 stack. Thus, the gate-stacks 8' of the peripheral device area PB and the bit-lines 8 of the memory cell area ZFB are formed simultaneously.

In a next process step oxide spacers 53 are formed on both sides of the bit-lines 8 of the memory cell area and on both sides of the gate stack 8' of the peripheral device region, simultaneously.

As shown in FIG. 8B, the bit-lines 8 are running in parallel to each other and perpendicular to the word-lines 2. The bit-line contacts are denoted with reference sign 41 In FIG. 8B and are provided at the crossing points of the active area lines 4 and the bit-lines 8.

Next process, a so-called X-implantation step is performed for defining extended source/drain regions (not shown) for off the peripheral devices.

Finally, the usual steps for completing the memory cell device are performed. In particular, stacked capacitors are formed on top of the structure and connected to the active area lines 4 on both sides of the bit-lines 8. However, these process steps are well-known in the art and will not be discussed in detail here. In this respect, explicite reference is made to U.S. Pat. No. 7,034,408 B1.

Although the present invention has been described with reference to a preferred embodiment, it is not limited thereto, but can be modified in various manners which are obvious for a person skilled in the art. Thus, it is intended that the present invention is only limited by the scope of the claims attached herewith.

The invention claimed is:

1. A manufacturing method for an integrated circuit having a semiconductor structure comprising:
    forming a peripheral circuitry in a peripheral device region, said peripheral circuitry comprising a peripheral transistor at least partially formed in a semiconductor substrate and having a first gate dielectric;
    forming a plurality of memory cells in a memory cell region, each of said memory cells comprising an access transistor at least partially formed in the semiconductor substrate and having a second gate dielectric;
    wherein the first gate dielectric is formed in a first high temperature process step; and the second gate dielectric is formed in a second high temperature process step; and
    wherein the first and second high temperature process step are performed before a step of forming a gate conductor of the access transistor in the memory cell region; and
    wherein the first gate dielectric in the peripheral device region is formed before forming the second gate dielectric and a conductive gate in the memory cell region.

2. The manufacturing method for an integrated circuit according to claim 1, wherein said first high temperature process is performed before said second high temperature process.

3. The manufacturing method for an integrated circuit according to claim 2, further comprising:
    forming an insulating layer over said substrate in said memory cell region;
    performing said first high temperature process;

depositing a first polysilicon layer over said insulating layer in said memory cell region and over said first gate dielectric in said peripheral device region;

depositing a nitride layer over said first polysilicon layer;

forming a hardmask over said nitride layer;

forming word-line grooves in said substrate in said memory cell region;

performing said second high temperature process; and forming said gate conductor over said second gate dielectric in said word-line grooves; and removing said hardmask and said nitride layer.

4. The manufacturing method for an integrated circuit according to claim 3, further comprising:

exposing a bitline contact region of said access transistor in said memory cell region in an etch process wherein said polysilicon layer and insulating layer are removed from said substrate;

depositing a second polysilicon layer in said memory cell region and in said peripheral device region; and planarizing said first and second polysilicon layers such that they form a planar common upper surface.

5. The manufacturing method for an integrated circuit according to claim 4, further comprising:

depositing at least one conductive layer over said planar common upper surface;

depositing an insulating layer over said at least one conductive layer; and simultaneously structuring said first and second polysilicon layers, said at least one conductive layer, and said insulating layer such that they form a bitline connected to said access transistor in said memory cell region and a gate stack of said peripheral transistor in said peripheral device region.

6. The manufacturing method for an integrated circuit according to claim 4, wherein the bitline contact region is defined photolithographically using a mask having a lines/space pattern so as to expose portions wherein the bitline contact region is to be exposed; and said etch processes wherein said polysilicon layer and insulating layer are removed from said substrate are selective with respect to said insulating layer.

7. The manufacturing method for an integrated circuit according to claim 5, wherein insulating sidewall spacers are simultaneously formed on said bitline in said memory cell region and on said gate stack in said peripheral device region.

8. The manufacturing method for an integrated circuit according to claim 1, wherein active area stripes separated by STI-trenches are formed along a first direction in said memory cell region and said access transistors are formed in said active area stripes.

9. The manufacturing method for an integrated circuit according to claim 8, wherein buried word-lines extending in a second direction are formed in said substrate in said memory cell region, said second direction intersecting said first direction.

10. The manufacturing method for an integrated circuit according to claim 9, wherein bitlines extending in a third direction are formed on said substrate in said memory cell region, said second and third direction being perpendicular to each other.

11. The manufacturing method for an integrated circuit according to claim 1, wherein said first and second high temperature processes are oxidation processes in a temperature range between 800 and 1100° C.

12. The manufacturing method for an integrated circuit according to claim 1, wherein the peripheral transistor and the access transistor each comprise a metallic gate conductor.

* * * * *